May 5, 1964 H. W. SEHER 3,131,476

PRODUCTION OF SEMICONDUCTOR BLANKS

Filed March 21, 1963 2 Sheets-Sheet 1

INVENTOR.
HENRY W. SEHER

BY [signature]

ATTORNEY

May 5, 1964 H. W. SEHER 3,131,476

PRODUCTION OF SEMICONDUCTOR BLANKS

Filed March 21, 1963 2 Sheets-Sheet 2

INVENTOR.
HENRY W. SEHER

BY [signature]

ATTORNEY

United States Patent Office 3,131,476

Patented May 5, 1964

3,131,476

PRODUCTION OF SEMICONDUCTOR BLANKS

Henry W. Seher, Elkins Park, Pa., assignor to Philco Corporation, Philadelphia, Pa., a corporation of Delaware Filed Mar. 21, 1963, Ser. No. 266,900
10 Claims. (Cl. 33—41)

The present invention relates to the production of semiconductor blanks and more particularly to the production of semiconductor units, commonly called "dice," for use in the manufacture of transistors and similar semiconductor devices.

Certain of these devices utilize individual semiconductor units or dice having, for instance, a thickness of the order of less than one hundredth of an inch and a width and length measuring a few hundredths of an inch, the individual units or dice being provided with contact regions or electrodes which are almost microscopic in size. Such minute units or dice are customarily obtained by fragmentizing a thin semiconductor wafer along perpendicular lines which are scribed on one face of the wafer to extend between rows of paired electrodes aligned in two perpendicularly related directions.

The invention, while capable of broader application, is especially useful when incorporated in a machine devised to cut scribed lines across the face of a wafer as noted above. Accordingly, the invention is described herein in conjunction with a scribing machine.

Prevalent problems and difficulties encountered in scribing a wafer have to do with locating and holding the wafer in proper and exact position with respect to the scribing tool of the machine so that a scribed line occurs precisely within a restricted inactive area between two adjoining active areas that is to say between areas containing paired electrodes or contact regions. Because of the close adjacency of these active areas or regions, it is most important that a wafer be oriented accurately and maintained positively in correct position with respect to the scribing tool, since even a slight displacement of the wafer frequently results in damage or destruction of the units or dice by the tool.

It is a primary object of the present invention to solve and overcome the above stated problems and difficulties and to satisfy the above noted requirements. Toward that end the invention provides apparatus which insures accurate positioning and firm retention of an electrode-bearing wafer so that it can be scribed with exactitude for subsequent separation into minute semiconductor units of the aforesaid variety.

It is also an object of the invention to achieve mass production of minute semiconductive units while attaining substantial reduction in the percentage of rejects due to scoring inaccuracies as well as to handling of the wafer. For that purpose the apparatus of the invention is such that proper orientation of the wafer can be accomplished with little direct manipulation of the wafer itself and that positive anchoring of a properly oriented wafter can be effected without deleteriously affecting the semiconductive material.

Another object of the invention is to reduce to a minimum the human factor and effort involved in attaining accurate scribing of the wafer. In this respect, a wafer oriented and retained in position in accordance with the principles of the invention can be worked upon in the scribing machine with assurance that the wafer will not be disturbed or moved from its established position.

A characteristic feature of the invention is that a wafer can be oriented and fixed in position for placement in the scribing machine while the latter is performing its scribing function on a previously oriented and fixed wafer. Thus the machine need not be idle beyond the comparatively short period of time required to remove a scribed wafer and replace it by one prepared for scribing.

To realize these objects and features, the invention provides an improved machine for performing work on a surface of a semiconductor wafer, which machine embodies novel apparatus for locating and holding the wafer in that position where the surface to be worked upon is properly related to the work-performing tool. In accordance with a broader aspect of the invention, provision is made to induce suction between cooperatively associated members for effecting a releasable coupling therebetween, one of the members having a surface for seating of a wafer thereon and incorporating means for subjecting a seated wafer to suction whereby the latter becomes firmly held in fixed adjusted position to be worked upon by the machine work-performing tool. In a specific and preferred embodiment, the apparatus includes distinct and separate members adapted for arrangement in superimposed relation and in required position, the members being so constructed that the holding suction occurs at their confronting faces and at the underside of the wafer. The holding effect of the suction inducing means is controllable so that coupling of the members, and of the wafer to one of the members, can be established or disestablished, selectively.

The invention as well as its objectives and advantages will be understood more fully from the following description based on the accompanying drawings, in which.

Figure 5:
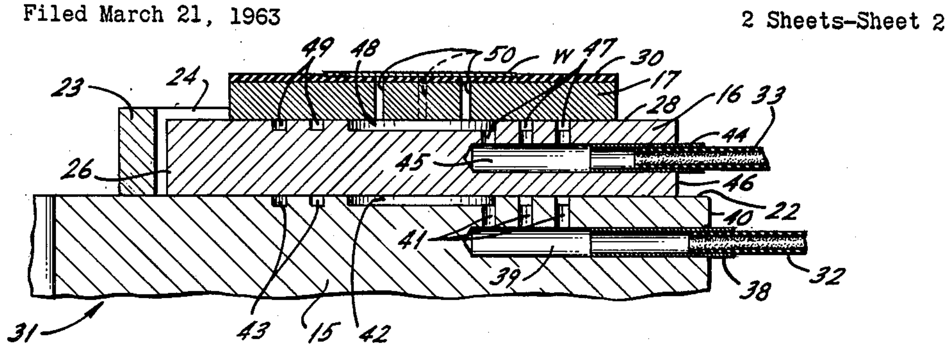
FIGURE 5 is an enlarged sectional view through an assembly of cooperatively associated stacked members.
Figure 7:
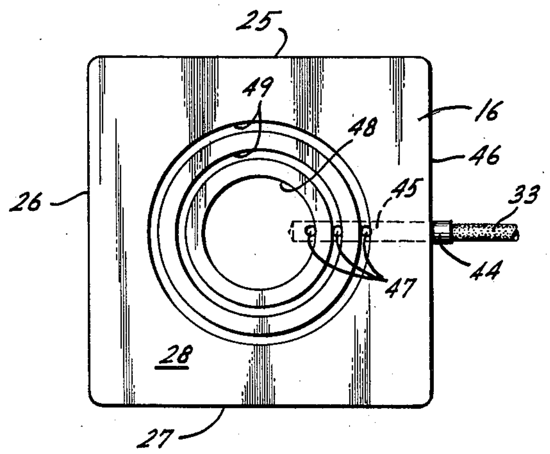
Figure 8:
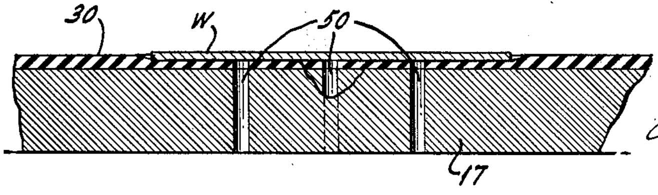

FIGURE 7 is a plan view illustrating, on a reduced scale, the top construction of the intermediate member of the assembly shown in FIGURE 5; and FIGURE 8 is a further enlarged fragmentary sectional view through the uppermost member of the assembly shown in FIGURE 5, and illustrates the seating of the wafer in a cushioning surface of said uppermost member as a result of suction at the underside of the wafer.

Figure 1:
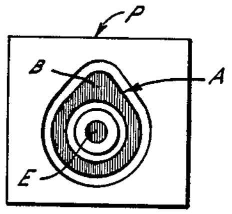
FIGURE 1 is a plan view illustrating, on a greatly magnified scale, one type of semiconductive unit such as is obtained subsequent to scribing and fragmentation of a semiconductor wafer.
Figure 2:
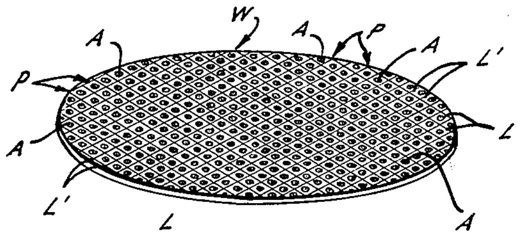
FIGURE 2 is a perspective view illustrating an enlargement of a semiconductor wafer scribed for fragmentation into a multiplicity of units of the kind shown in FIGURE 1.

With more particular reference to the drawings, and initially to FIGURE 1 thereof, there is illustrated a transistor unit P of epitaxial planar double-diffused silicon type having an active area A which exhibits a base contact region B and an emitter contact region E. Individual units of this type are procured from a semiconductor wafer W as represented in FIGURE 2. One face of this wafer is formed with active areas A aligned in perpendicularly related rows, and with perpendicularly scribed lines L and L' between the rows to outline generally square sections adapted, upon fragmentation of the wafer along the scribed lines, to constitute units such as the one shown in FIGURE 1.

The procedure followed to produce such a wafer, to form contact regions thereon and to effect fracture of such a scored wafer are well known and need not be described herein. The present invention is concerned with an improved machine for holding and scribing the wafers. The novel structural features of this machine appear to good advantage in FIGURES 3 and 4 of the drawings, which are considered in the immediately following description.

As illustrated, the machine includes a slide 10 carrying a scribing diamond pointed tool 11 and mounted on an elongated rail 12 for reciprocating motion through operation of a pivotal arm 14 of conventional power driven crank means (not shown). The slide 10 functions to move the scribing tool 11 in a rectilinear path to scribe a wafer supported for engagement by the tool. In order to avoid damage to or destruction of the active areas or contact regions, the wafer must be located and held in precise position when contacted by the scribing point of tool 11 and, in particular accordance with the invention, the machine incorporates apparatus for so locating and holding a wafer.

As shown in the drawings, including FIGURES 3 through 7, this apparatus includes a base member 15, a manipulatable main member 16 and a manipulatable auxiliary member 17. The base member 15 is mounted for sliding motion in a straight path traversing the rectilinear path of movement of scribing tool 11. For that purpose the base member has a bottom groove 18 (FIGURE 4) riding on a close fitting guide track 19 formed on bed 20 carried by machine table 21. The track 19 lies in a direction normal to guiding rail 12 and extends rearwardly and forwardly thereof so as to guide the base member 15 throughout its sliding movement beneath the scribing tool.

Figures 3, 4:
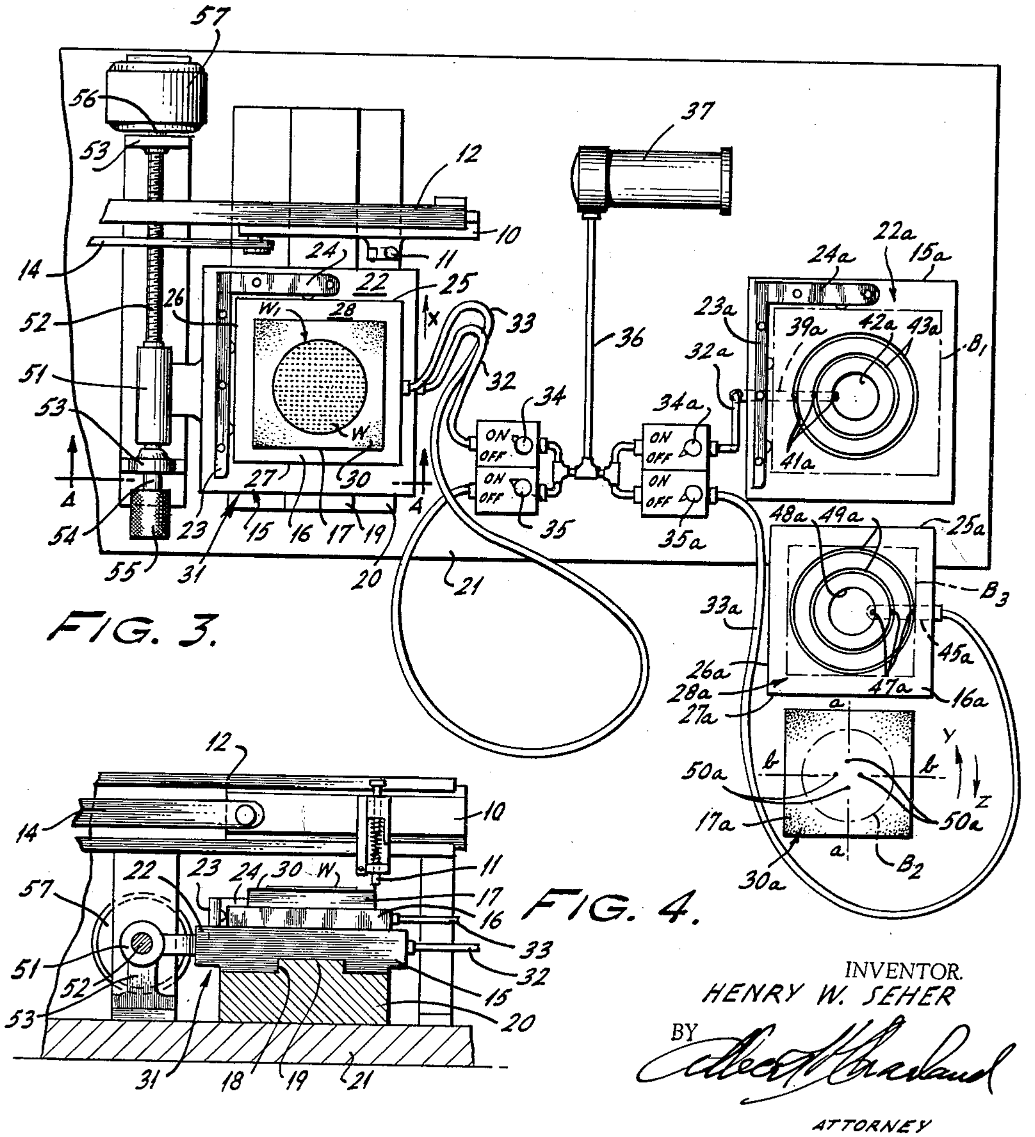
FIGURE 3 is a plan view illustrating the essential parts of a machine constructed in accordance with the invention for scribing wafers as shown in FIGURE 2 to obtain semiconductive units of the type illustrated in FIGURE 1.
FIGURE 4 is a horizontal sectional view taken substantially on line 4—4 of FIGURE 3.
Figure 6:
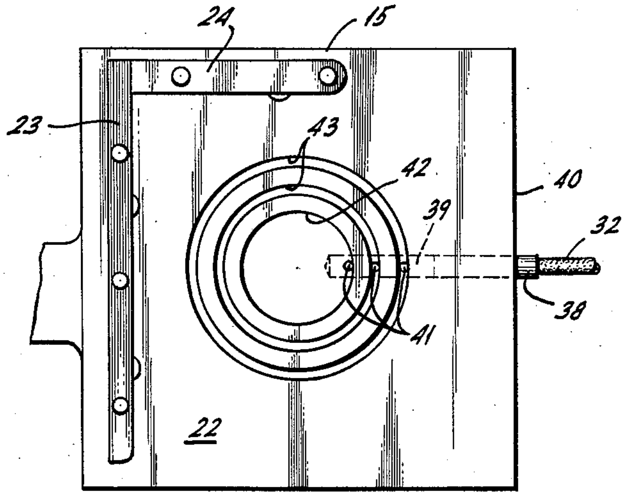
FIGURE 6 is a plan view illustrating, on a reduced scale, the top construction of the lowermost or base member of the assembly shown in FIGURE 5.

The main member 16 is adapted to be placed manually upon the top face 22 of base member 15 and to occupy a generally centralized position thereon, which position is determined by means of locators 23—24 precisely disposed on the base member 15 to contact with main member 16 when placed on said base member. As best seen in FIGURES 3 and 6, the locators 23—24 are arranged upon and fixed to the aforesaid top face of base member 15 to define a rigid right angle and, as best seen in FIGURES 3 and 7, the main member 16 is in the form of a square plate with at least three contiguous sides 25, 26 and 27 so related as to constitute two right angles each corresponding exactly to the right angle defined by the aforesaid locators. In this manner the right angularly related locators assure desired positioning of the main member 16 whether its adjacent sides 25 and 26 or its adjacent sides 26 and 27 are directed for abutting engagement with said locators.

The auxiliary member 17 is adapted to be placed manually upon the top face 28 of main member 16 and is of such a size as to overlie a major area of the said face 28 of the main member. The auxiliary member has a cushioning surface for seating of a wafer W to be worked upon by the scribing tool 11 and, as illustrated, this wafer seating surface is provided by means of a layer 30 (see particularly FIGURE 8) of frictional slightly compressible material, such as rubber or vinyl, affixed upon and covering that face of the auxiliary member 17 which is adapted to underlie the scribing point of tool 11. As shown, the auxiliary member 17 is square in shape, but it will be understood that this member may be given a different shape so long as its dimensions remain such that it overlies a major area of face 28 of the main member 16 and can afford proper seating of a wafer W.

The members 15, 16 and 17, and a wafer associated therewith, are adapted to be maintained positively in stacked relation to constitute a unitary assembly indicated in its entirety by reference character 31. For that purpose the base member 15, the manipulatable main member 16 and the manipulatable auxiliary member 17 are constructed with means effective to provide a releasable coupling between said base and main members, between said main and auxiliary members and between said auxiliary member and the wafer thereon. In accordance with the invention the coupling is established by suction induced at the contacting faces of the superimposed members and wafer, and the means for inducing such suction includes a pair of flexible tubes 32 and 33 communicating through control valves 34 and 35, respectively, with conduit 36 (FIGURE 3) leading to a conventional motor-driven suction pump 37.

As clearly shown in FIGURES 5 and 6, the tube 32 is provided with a nipple 38 fitting in a bore 39 which is formed in base member 15 and opens at side 40 thereof. The bore 39 communicates through apertures 41 with concentric recess 42 and grooves 43, which recess and grooves are sunk into and open at the top face 22 of the base members so as to underlie and be covered by the manipulatable main member 16. Thus with valve 34 (FIGURE 3) in open or "On" position, suction acts on the main member 16 to maintain the same in fixed position on base member 15.

As more clearly shown in FIGURES 5 and 7, the tube 33 is provided with a nipple 44 fitted in a bore 45 which is formed in the manipulatable main member 16 and opens at side 46 thereof. The bore 45 communicates through apertures 47 with concentric recess 48 and grooves 49, which recess and grooves are sunk into and open at top face 28 of main member 16 as to underlie and be covered by the manipulatable auxiliary member 17 when placed upon said top face of the main member. In this manner, the auxiliary member 17 becomes immovably held on the base member 15 by suction created between these two members when the control valve 35 (FIGURE 3) is moved to its open or "On" position.

As clearly appears in FIGURE 5, the aforesaid auxiliary member 17 and its surface layer 30 are provided with a plurality of ports 50 extending transversely through the thickness of said member and layer. The ports 50 are disposed to register with recess 48 of the auxiliary member and to underlie a wafer seated in proper oriented position upon the cushioning surface provided by the aforesaid layer 30. Because of this structure, suction is applied to the underside of the wafer when the valve 35 (FIGURE 3) is in "On" position. Under this condition, suction acts to draw the wafer onto the layer 30 so that, as represented in FIGURE 8, the wafer slightly depressses said layer and becomes snugly cushioned and fixedly held thereon. Thus the properly oriented wafer, in effect, becomes part of the hereinbefore mentioned movable assembly 31.

To impart movement to this assembly, the base member 15 is constructed, as seen in FIGURES 3 and 4, with a rigid sleeve 51 which is arranged in screw threaded engagement with an axially rotatable threaded shaft 52 journalled in bearings 53. One end portion 54 of this shaft is provided with a knob 55 for manually operating the shaft. The other end portion 56 of the shaft is connected to a motor 57 for mechanically driving said shaft.

In accordance with the invention the motor 57 is adapted to drive the shaft 52 intermittently so as to move the intercoupled members and wafer in a step-by-step fashion. In this manner the wafer is displaced in synchronism with the scribing stroke of tool 11 and is brought through a series of alternating motions and pauses to successive positions in each of which the scribing point of the tool is directly in line with a space between adjacent rows of active regions or electrode areas of the wafer so that tool scribes a line within that space while clearing said active regions. For that purpose the motor 57 is of the synchronous type and its shaft driving function, with respect to the tool reciprocating mechanism, can be and preferably is controlled by electronic means such as disclosed and claimed in co-pending application Serial No. 263,302 filed March 6, 1963 in the name of Earl R. Kreinberg, and assigned to the assignee of the present application.

In using the machine so far described, the assembly 31—disposed, for example, as shown in FIGURE 3 where adjacent sides 25 and 26 of main member 16 are in engagement with locators 24 and 23—is moved in the direction of arrow X by manipulation of knob 55 to bring the wafer W to an initial position where the area first to be scribed is located in accurate alignment with the scribing point of tool 11. To facilitate adjustment of the wafer in that initial position, it is preferable to carry out the adjustment while viewing the tool scribing point and the wafer area adjacent its leading edge W' through a suitable magnifying instrument for example a microscope of sufficient power to render clearly discernible several adjacent electrode areas and the spaces therebetween. When the required positioning of the wafer has been established, the motor 57 is energized to rotate the threaded shaft 52 in the above-noted controlled manner for effecting progressive step-by-step advancement of the wafer intermittently with the scribing strokes of tool 11. In this way there is scribed a first series of parallel lines in the spaces between successive rows of electrodes extending across the wafer in one direction.

Following the completion of scribed lines in that one direction, the operation of the machine is stopped, valve 35 is left in "On" position so that the auxiliary member 17 and wafer remain undisturbed with respect to the main member 16, and the valve 34 is moved to "Off" position thus breaking the coupling suction between the base member 15 and the main member 16. Under this condition the main member is manually turned 90° and placed in position with its adjacent sides 26 and 27 in abutting engagement with locators 24 and 23. In this simple manner the wafer becomes oriented for a second scribing operation. For that operation the valve 34 is moved to "On" position to reinstate the coupling suction between the base and main members, the assembly 31 is adjusted to align the wafer with the scribing tool in the above-described manner, and the machine is again set in operation to scribe a second series of parallel lines extending in a direction at right angles to the aforesaid one direction, thus obtaining the fully scribed wafer seen in FIGURE 2. A wafer which has been scribed in the machine may readily be removed therefrom after the assembly 31 returns to the position shown in FIGURE 3 and the suction coupling is released as above noted.

A machine constructed in accordance with the invention can and preferably does include means which, while a wafer is being worked upon in the scribing section, makes it possible to effect proper orientation of another wafer in preparation for insertion in that section. For that purpose the machine as shown in FIGURE 3 is provided with a second base member 15*a* similar in construction to the first mentioned base member 15. However in contradistinction to said first main member 15 which is slidable and associated with a flexible tube 32, the second base member 15*a* is fixed on the machine table 21 and is associated wtih a rigid conduit 32*a*. This latter conduit communicates through a control valve 34*a* with suction conduit 36 and also communicates through a duct 39*a* and apertures 41*a* with concentric recess 42*a* and grooves 43*a* sunk into and opening at the top face 22*a* of said fixed base member 15*a* which has right angularly related rigid locators 23*a* and 24*a*. The construction and arrangement of these locators 23*a* and 24*a* on the second base member 15*a* are identical to the construction and arrangement of locators 23 and 24 on the first base member 15 so that the first mentioned manipulatable main member 16 and a second manipulatable main member 16*a*, having contiguous sides 25*a* and 26*a* and 27*a* which correspond exactly to the contiguous sides 52, 26 and 27 of said first member, can interchangeably be placed and located exactly in identical position either on the slidable base member 15 or on the fixed base member 15*a*.

The second manipulatable main member 16*a* is associated with a flexible tube 33*a* which communicates through a control valve 35*a* with the suction conduit 36. This tube 33*a* also communicates through a duct or bore 45*a* and through apertures 47*a* with concentric recess 48*a* and grooves 49*a* sunk into and opening at the face 28*a* of said member 16*a* which is adapted to support a second manipulatable auxiliary member 17*a*. This latter auxiliary member 17*a* is of a construction similar to the first mentioned auxiliary member 17 in that it is of a size to overlie and cover the recess 48*a* and grooves 49*a* of member 16*a*, has a covering layer 30*a* of frictional yieldable material to provide a cushioning surface for a wafer deposited thereon, and is provided with ports 50*a* extending through the thickness of said second auxiliary member 17*a* and its covering layer 30*a*.

In using the wafer pre-orienting means as shown at the right hand side of FIGURE 3, the manipulatable member 16*a* is placed on the fixed base member 15*a* in the position represented by broken lines $B_1$ so that two adjacent sides, for instance sides 25*a* and 26*a* of said member 15*a* abut locators 24*a* and 23*a* respectively. When so positioned the member 16*a* is securely coupled to the fixed base member 15*a* by establishing a suction condition between the contacting faces of said members, which condition is brought about by moving the control valve 34*a* to "On" position. Thereafter the manipulatable auxiliary member 17*a* with a wafer deposited on the cushioning layer surface 30*a* in the position represented by broken lines $B_2$ to overlie the ports 50*a*, is placed on main member 16*a* in position represented by broken line $B_3$ to cover the recess 48*a* and grooves 49*a*, the aforesaid ports 50*a* being disposed in registration with said recess. The wafer when deposited on the auxiliary member 17*a* should be so oriented that the right angularly related rows of active areas A (FIGURE 2) extend in planes corresponding to perpendicularly related planes represented at *a—a* and *b—b* in FIGURE 3. When the wafer and auxiliary member 17*a* are placed together on the main member 16*a* the latter being securely coupled to the fixed base member 15*a*, proper orientation of the wafer can be assertained by observing its electrode bearing surface through a suitable microscope viewer inscribed with hairlines corresponding to said planes *a—a* and *b—b*. Proper orientation of the wafer exists when the spaces between adjacent rows of active areas coincide exactly with such hairlines. Should correction be needed to establish exact coincidence, this can be accomplished by displacing the auxiliary member 17*a* in either of the directions represented by arrows Y and Z until the required coincidence is observed. When such coincidence is established, the valve 35*a* is moved to "On" position thus effecting a suction coupling between main member 16*a* and auxiliary member 17*a*, and between the latter and the wafer thereon.

Under the conditions described above, when the first main member 16 with the first auxiliary member 17 and a scribed wafer thereon is removed from the slidable base member 15, the second main member 16*a* with the second auxiliary member and wafer oriented and fixed thereon can be transferred from fixed base member 15*a* to said slidable base member 15 so that said wafer can be scribed in the manner hereinabove described. To effect the transfer, control valve 34*a* is moved to "Off" position thus releasing the coupling between base 15*a* and main member 16*a*, control valve 35*a* being left in its "On" position so that suction continues to maintain the coupling between said main member and the auxiliary member 17*a* as well as between the auxiliary member and the wafer to be scribed so that the latter is held in established oriented position on the auxiliary member 17*a*. Because locators 23 and 24 and locators 23*a* and 24*a* are of identical construction and arrangement, the wafer fixedly seated on and transferred with intercoupled members 16*a* and 17*a* will remain properly oriented when member 16*a* is brought into engagement with said locators 23 and 24 and coupled with slidable base member 15 to effect accurate scribing in accordance with the above explained procedures.

From the preceding description, it will be appreciated that the present invention provides apparatus whereby electrode bearing wafers are readily scored for subsequent separation into individual semiconductor units, the scribing being done with utmost precision thereby assuring a high yield of uniform undamaged units. It will also be appreciated that the machine of this invention simplifies the ordinarily tedious task of acquiring precise orientation of a wafer to be scribed properly, and that the machine effects substantial saving in time required to procure semiconductive units from an electrode bearing wafer because, during scribing of one wafer, another wafer can be accurately oriented and held in accurate oriented position for a subsequent scribing operation.

While a preferred embodiment has been shown and described, it will be understood that the invention is not limited to specific structures of that embodiment but embraces such changes and variations as come within the scope of the subjoined claims.

What I claim is:

1. A machine for performing work on one side of a wafer, comprising a movable work-performing tool, a movable wafer-supporting assembly including three separate members arranged in superimposed relation and normally free from each other, the lower member having means for locating the intermediate member in predetermined position with respect to said tool, the upper member having a surface for seating of a wafer thereon, means for inducing suction between said members and between said surface and a wafer thereon to maintain said members and the wafer in superimposed engagement, the aforesaid suction inducing means incorporating control means for interrupting the suction between the lower and intermediate members while maintaining suction between the intermediate and upper members and between the upper member and wafer to provide for disassociation of said intermediate and upper members and wafer as a unit from said lower member.

2. A machine as set forth in claim 1, in which the lower member has a top formed with a recess and grooves disposed to underlie the bottom of the intermediate member, said intermediate member having a top formed with a recess and grooves disposed to underlie the bottom of the upper member, said upper member having ports opening at the wafer-seating surface thereof and into the recess of said intermediate member, said recesses, grooves and ports constituting parts of the suction inducing means, the latter further including a suction pump and conduit means establishing communication between said pump and said recesses and grooves, and the mentioned control means being interposed between the aforesaid suction pump and conduit means.

3. A machine for scribing a line between rows of electrode bearing areas on a wafer, comprising a scribing tool movable in a rectilinear path, a base member movable in a rectilinear path traversing the path of movement of said tool, a main member placeable in free contact upon the base member, an auxiliary member placeable in free contact upon the main member and having a surface for supporting a wafer for presentation to said tool, suction inducing means for establishing a releasable suction coupling between said members and a wafer thereon, the suction inducing means incorporating control means for disrupting the suction coupling between the base and main members while maintaining the suction coupling between the main and auxiliary members and between the auxiliary member and wafer to provide for disassociation of said main and auxiliary members and wafer as a unit from said base member, and means for moving the coupled members and wafer thereon as a unit in synchronism with the movement of the aforesaid tool.

4. A machine as set forth in claim 3, in which the suction inducing means includes a recess and concentric grooves sunk into and opening at the top face of each of the base and main members and ports formed in the auxiliary member to open at its wafer-supporting surface and into the recess of the main member, said suction inducing means further including a suction pump and conduit means establishing communication between said pump and said recesses and grooves, and the mentioned control means being interposed between the aforesaid suction pump and conduit means.

5. A machine for scribing a line between rows of electrode bearing areas on a wafer, comprising a scribing tool movable in a rectilinear path, a base member movable in a rectilinear path traversing the path of movement of said tool, a main member placeable in free contact upon said base member, locator means fixedly carried by said base member and engageable with said main member to locate the latter in predetermined position on said main member, an auxiliary member placeable in free contact upon the main member and adapted to support a wafer for presentation to said tool, suction inducing means for establishing a releasable suction coupling between said members and a wafer thereon, the suction inducing means incorporating control means for releasing the suction coupling between the base member and the main member while maintaining the coupling between the main member and the auxiliary member and between the auxiliary member and the wafer supported thereon, and means for moving the coupled members and wafer as a unit in synchronism with the movement of the aforesaid tool.

6. A machine for scribing one face of a wafer to be fragmented into a plurality of minute individual units, comprising a scribing tool mounted for movement in a rectilinear path, a base member mounted for sliding motion in a path traversing the path of movement of said tool, locators fixed on said base member and arranged thereon to form rigid angularly related abutments, a manipulatable main member placeable in free contact upon the base member and having rectangularly disposed perimetrical sides for abutting engagement with said locators to fix the position of the main member on the base member, a manipulatable auxiliary member placeable in free contact upon the main member and having a cushioning surface for seating of a semiconductor wafer thereon, suction means for releasably coupling the main member to the base member and the auxiliary member to the main member, port means provided in the auxiliary member to communicate with the suction means and opening through said cushioning surface to effect a releasable coupling between said surface and a semiconductor wafer seated thereon, and control means for releasing the suction coupling between the base member and the auxiliary member while maintaining the suction coupling between the main member and the auxiliary member and between the aforesaid surface and wafer seated thereon.

7. A machine as set forth in claim 6, in which the mentioned locator means consists of right angularly related abutment elements, and in which the main member has right angularly related sides for abutting engagement with said elements.

8. A machine for scribing one face of a wafer to be fragmentized into a plurality of minute individual units, comprising a machine table, a scribing tool movable in a rectilinear path above said table, a first base member mounted on said table for movement beneath the scribing tool in a rectilinear path transversely of the path of movement of said tool, a second base member fixedly mounted on said table, a first main member and a second main member placeable interchangeably on either base members, a first auxiliary member and a second auxiliary member placeable interchangeably on either main member, each auxiliary member having a surface for seating of a wafer thereon to present one face of the wafer to said tool, suction inducing means for establishing a releasable suction coupling between a base member and a main member placed thereon, between a main member and an auxiliary member placed thereon and between an auxiliary member and a wafer seated thereon, the aforesaid suction inducing means incorporating control means for disrupting the suction coupling between a base member and a main member placed thereon while maintaining the suction coupling between said main member and an auxiliary member placed thereon and between said auxiliary member and a wafer seated thereon.

9. A machine as set forth in claim 8, in which identical locator means are provided on the base members for locating either main member in predetermined identical position on one or the other of said base members.

10. A machine as set forth in claim 8, in which identical locator means are provided on the base members for locating either main member in predetermined identical position on one or the other of said base members, said locator means consisting of right angularly related abutment elements, each main member having right angularly related sides for abutting engagement with said elements.

References Cited in the file of this patent

UNITED STATES PATENTS

| | | |
|---|---|---|
| 1,115,333 | Pease | Oct. 27, 1914 |
| 1,666,634 | Thomson | Apr. 17, 1928 |
| 2,357,206 | Klages | Aug. 29, 1944 |
| 2,367,839 | Grover | Jan. 23, 1945 |
| 2,527,338 | Stamm | Oct. 24, 1950 |
| 2,984,949 | Dayton | May 23, 1961 |
| 3,052,479 | Trell | Sept. 4, 1962 |